(12) United States Patent
Tam

(10) Patent No.: US 6,912,167 B2
(45) Date of Patent: Jun. 28, 2005

(54) SENSING CIRCUIT (75) Inventor: Simon Tam, Cambridge (GB)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 10/602,739

(22) Filed: Jun. 25, 2003

(65) Prior Publication Data
US 2004/0095823 A1 May 20, 2004

(30) Foreign Application Priority Data
Jun. 27, 2002 (GB) .............................. 0214904

(51) Int. Cl.⁷ .............................................. G11C 7/00
(52) U.S. Cl. ................... 365/207; 365/189.09
(58) Field of Search ............ 365/207, 189.09; 348/294, 301

(56) References Cited

U.S. PATENT DOCUMENTS

| 5,274,583 | A |  | 12/1993 | Rapp |  |
|---|---|---|---|---|---|
| 5,311,469 | A |  | 5/1994 | Hoshi et al. |  |
| 6,128,039 | A | * | 10/2000 | Chen et al. | 348/294 |
| 6,333,870 | B1 | * | 12/2001 | Kang | 365/145 |
| 6,351,283 | B1 | * | 2/2002 | Liu | 348/301 |
| 6,462,979 | B2 | * | 10/2002 | Schlosser et al. | 365/158 |
| 6,522,568 | B1 |  | 2/2003 | Nair | 365/145 |
| 2002/0060923 | A1 |  | 5/2002 | Thompson et al. | 365/145 |
| 2002/0141222 | A1 |  | 10/2002 | Nair et al. | 365/145 |

FOREIGN PATENT DOCUMENTS

| DE | 195 06 134 A1 | 9/1995 |
|---|---|---|
| JP | A 9-91970 | 4/1997 |
| WO | WO 02/17322 A2 | 2/2002 |
| WO | WO 02/017322 A2 | 2/2002 |

* cited by examiner

Primary Examiner—Vu A. Le
(74) Attorney, Agent, or Firm—Oliff & Berridge, PLC (57) ABSTRACT A sensing circuit comprises a charge integrating sense amplifier 4 serially coupled to a discriminator 6. The sensing circuit can be used to sense the logic status of the cells in a random access memory (RAM) system, including ferroelectric RAMs. The use of a charge integrating sense amplifier enables the effect of bit line capacitance intrinsic to RAM circuits to be overcome and also provides efficient charge to voltage conversion gain.

31 Claims, 4 Drawing Sheets

SENSING CIRCUIT

The present invention relates to sensing circuits.

Sensing circuits, usually in the form of sense amplifiers, are in widespread use. A sense amplifier is considered to be a vital component of a random access memory (RAM) system where its function is to provide recognition and amplification of the voltage level, representing digital information, stored in a memory element within a matrix of memory cells.

The matrix of memory cells can be regarded as a matrix of storage capacitors and the majority of existing sense amplifiers are based on voltage sensing of the charge stored in the storage capacitors. The voltage level across any storage capacitor corresponds to the logic state or information stored in the capacitor ('0' or '1'). In the simplest form of sensing circuit the level of the voltage across the storage capacitor is compared to an intermediate value and the difference is amplified to indicate whether the logic state '0' or '1' is stored in the capacitor. However, when the information is fed into the cell only a small amount of charge redistribution occurs in the storage capacitor and, hence, the level of the voltage stored in any storage capacitor of the memory cell array is very low. Therefore, it is difficult for the sense amplifier to differentiate between a logic '0' and logic '1' stored in any cell and, accordingly, very sensitive high gain amplifiers must be used, with the attendant increase in costs.

An improved form of sensing circuit has also been proposed in which the voltages of a pair of memory cells storing the digital information as complimentary logic are compared and positive feedback is used to amplify the minute voltage differences occurring between the pair of cells. However, because the voltage differences are minute, extremely sensitive high gain sense amplifiers must again be used.

It is also known to configure RAM circuits as a ferroelectric memory, where the conventional capacitors of the memory cell are constituted by ferroelectric capacitors. In such ferroelectric RAMs, the logic state '0' or '1' corresponds to the polarisation stale of the capacitor when the voltage applied across the ferroelectric capacitor is zero.

Figure 1:
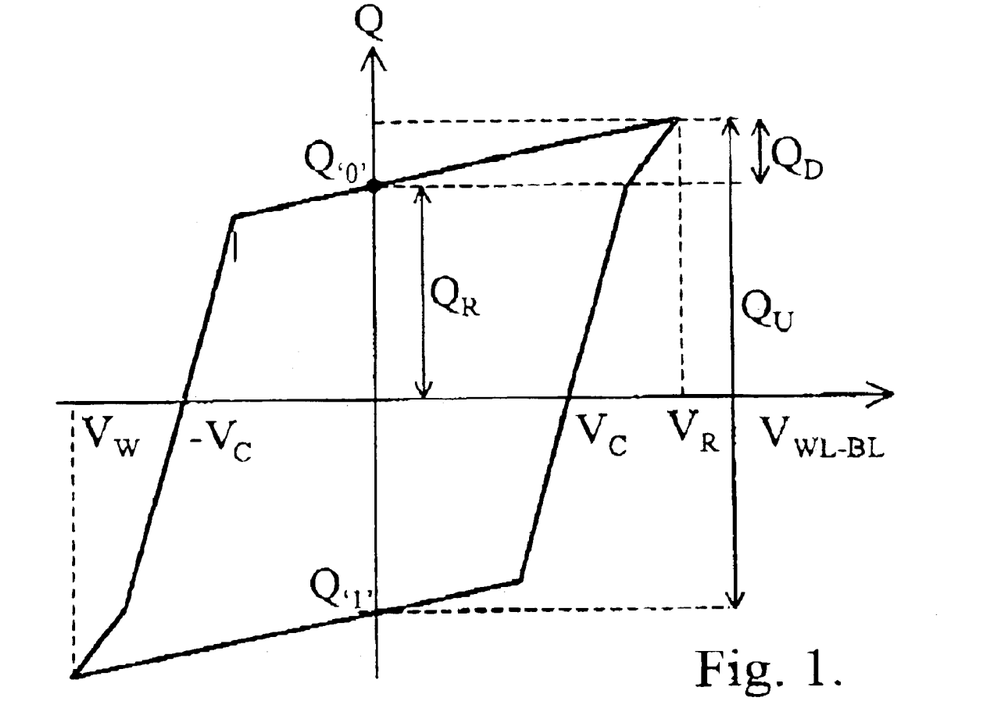
FIG. 1 shows a typical charge-voltage characteristic for a ferroelectric capacitor.

A typical characteristic for a ferroelectric capacitor is shown in FIG. 1. It can be seen from FIG. 1 that the ferroelectric capacitors have two polarisation states and also exhibit dielectric hysteresis. To switch such a ferroelectric capacitor from one polarisation state to the other polarisation state, dependent upon the current polarisation state of the capacitor, either a negative voltage pulse having a magnitude which is more negative than a voltage $-V_c$ or a positive voltage pulse having a magnitude which is more positive than a voltage $V_c$ must be applied to the cell. Thus, to write information such as the logic state '1' into the cell, a negative write pulse of magnitude $V_W$ is applied, which is more negative than the voltage $-V_c$ and results in a charge $Q_{-1}$, being stored in the cell. The detection of the polarisation state of the cell, i.e. whether a charge $Q_{-1}$, or $Q_{-0}$, is stored, is performed by applying a positive read pulse of magnitude $V_R$, which is more positive than the voltage Vc, and checking whether there is any switch in the polarisation state of the cell. For example, assuming that the logic state '1' is initially stored in the cell. The charge stored in the ferroelectric capacitor is therefore $Q_{-1}$, as shown in FIG. 1. The application of the read pulse $V_R$ would cause the ferroelectric capacitor to switch polarisation states, resulting in a charge $Q_{-0}$, after the cessation of the read pulse. The change in charge $Q_{-1}$,$-Q_{-0}$, indicates that the information stored in the cell was the logic state '1'. However, if the logic state '0' was initially stored in the cell, the application of the positive read pulse $V_R$ would not cause the ferroelectric capacitor to change polarisation states. Hence, because a change in polarisation state has not occurred, the change in charge is minimal and this indicates that the logic state '0' was stored in the cell.

A switch in the polarisation state gives rise to an outflow of charge, which is detected by a sense amplifier. However, it can be seen from FIG. 1 that when the read pulse $V_R$ is applied and a change in polarisation occurs, the charge in the ferroelectric capacitor has changed from $Q_{-1}$, to $Q_{-0}$,; the charge does not return to $Q_{-1}$, unless a negative pulse of magnitude more negative than at least $-V_c$ is applied. Hence, the initially stored logic state is erased when the change in polarisation state occurs and the stored data is lost and must be replenished if it is required subsequently for another purpose. Because the stored logic state is lost, this reading of the information in the cell is known as destructive readout.

Figure 2:
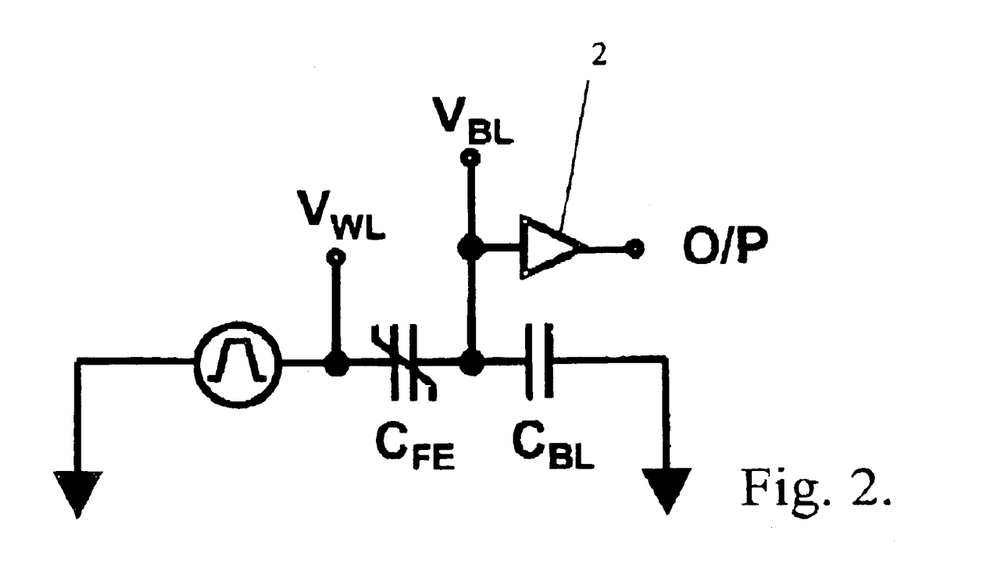
FIG. 2 shows a voltage sensing sense amplifier for use with a ferroelectric memory.

It has been proposed to modify the voltage sensing sense amplifier to sense any charge flowing out from the ferroelectric capacitor, and such a circuit is shown schematically in FIG. 2. Generally, a ferroelectric dynamic RAM cell comprises a bit line BL, the voltage on which when information is read from the cell is indicative of the logic state stored in the cell, and a word line WL for the simultaneous application of read signals to a row of ferroelectric capacitors, the ferroelectric capacitor $C_{FE}$ shown in FIG. 2 being one of this row of capacitors. An amplifier 2 is coupled to the bit line BL to provide an output signal O/P in response to any charge flowing from the ferroelectric capacitor arising from any change in the polarisation state when the cell is read. A bit line reference capacitor $C_{BL}$ is provided which is connected to the bit line BL, and the change in charge due to a switch in polarisation of the ferroelectric capacitor is reflected as a change in voltage across the reference capacitor $C_{BL}$. This voltage appears on the hit line BL and is amplified by the amplifier 2 to provide the output signal O/P.

In order to provide a swing in the output signal O/P of reasonable magnitude, the value of the reference capacitor $C_{BL}$ must be kept relatively small. The problem with this sensing technique is that if there is a switch in polarisation of the ferroelectric capacitor $C_{FE}$, the voltage stored in the reference capacitor $C_{BL}$ will reduce the effective voltage between the word line WL and the bit line BL. This makes it difficult to use a small excitation or read voltage $V_R$, as shown in FIG. 1, to interrogate the cell so as to reduce overall power consumption of the cell array. It is possible to reduce the size of the reference capacitor $C_{BL}$ by reducing the size of the storage cells but if the polarisation state does change, the charge stored is also reduced and, therefore, there is less voltage at the output to the amplifier 2, which in turn means that the amplifier 2 must be made more sensitive to provide a sufficient change in output signal O/P with a change in polarisation state.

Also, it is known that dynamic RAM cells exhibit bit line capacitance which is intrinsic to the memory cell layout and cannot be reduced. As the value of the reference capacitor $C_{BL}$ is made smaller with reducing cell size in order to achieve snore cells per bit line and greater overall memory capacity, a limit to the memory capacity can easily be reached because the bit line capacitance becomes large when compared to the reference capacitor $C_{BL}$ and will dominate. This results in a drastic reduction in the swing of the bit line voltage during readout, which necessitates the use of very sensitive and very high gain amplifiers to achieve reliable readout, with their attendant higher costs.

The present invention seeks therefore to provide an improved form of sensing circuit which, in a preferred application, enables the memory capacity of a RAM system to be increased and which also enables the memory cell and hence the system power consumption to be decreased. The present invention also seeks to provide an improved method of operating a sensing circuit.

According to a first aspect of the present invention, there is provided a sensing circuit for sensing an electrical charge stored in a capacitor element comprising a charge integrator circuit arranged to receive an electrical charge from a capacitor element, and a discriminator circuit coupled in series with the charge integrator circuit, the discriminator circuit having a first input arranged to receive an output signal from the integrator commit and a second input arranged to receive a reference voltage signal.

The charge integrator circuit may comprise an amplifier, a feedback capacitor coupled between an input and an output terminal of the amplifier for storing electrical charge received from the capacitor element, first switching means coupled to one side of the feedback capacitor for connecting the said one side to a first electrical supply, and second switching means coupled to the other side of the feedback capacitor for coupling the said other side to a further electrical supply.

In an alternative arrangement, the discriminator circuit comprises an inverter circuit arranged to provide an output signal which changes from a first level to a second level, which differs from the first level, when the magnitude of an output signal from the charge integrator circuit exceeds a reference value.

In accordance with a second aspect of the present invention, there is provided a method of operating a sensing circuit comprising a charge integrator circuit, coupled in series with a discriminator circuit and arranged to receive an electrical charge stored in a capacitor element of an array of capacitor elements each for storing an electrical charge, the method, comprising applying a first pulse signal to the said capacitor element and to selected other capacitor elements in the array, applying a second pulse signal too the said capacitor element and to selected other capacitor elements in the array, applying third and fourth pulse signals to selected other capacitor elements in the array, the first, second, third and fourth pulse signals being arranged to cause the electrical charge stored in the said capacitor element to be transferred to the charge integrator circuit but not to cause charge stored in other capacitor elements to be transferred to the charge integrator circuit.

The present invention also provides a random access memory circuit, or a biosensor, such as a DNA sensor or a fingerprint sensor, or a charge coupled device such as a camera or microscope, incorporating a sensing circuit according to the first aspect of the present invention or operated by a method according to the second aspect of the present invention.

The present invention will now be described by way of further example only, with reference to the accompanying drawings in which.

Figure 3:
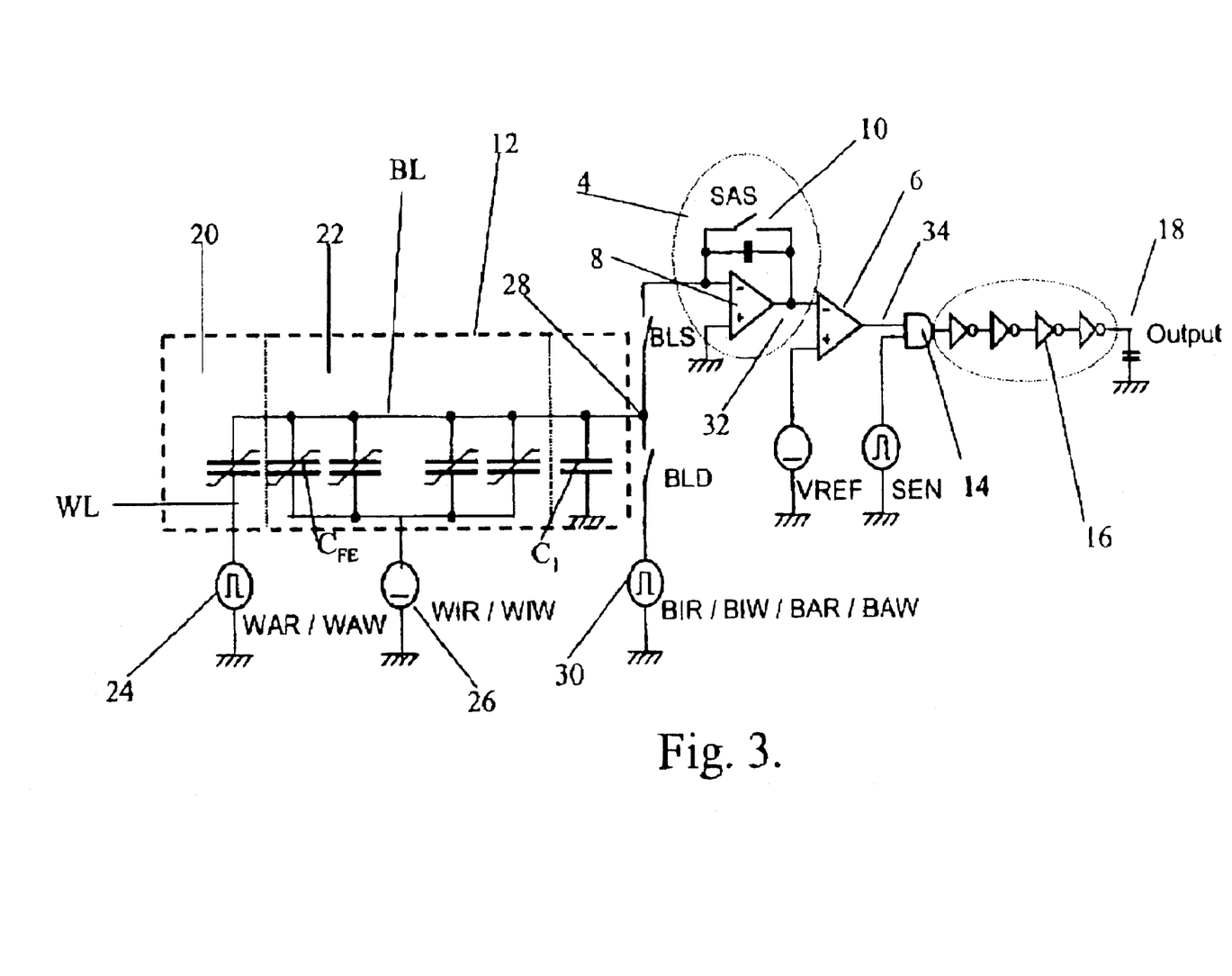
FIG. 3 shows a circuit for the detection of data stored in a ferroelectric memory and incorporating a sensing circuit in accordance with the present invention.

Referring to FIG. 3, a sensing circuit according to the present invention comprises an integrator circuit 4 which is coupled in series with a discriminator circuit 6. The integrator circuit 4 comprises an amplifier 8 with a feedback capacitor 10 and switching means SAS connected in parallel with the feedback capacitor 10.

The amplifier 8 has a first inverting input which can be coupled, to a ferroelectric RAM cell 12 via first switching means BLS and a second non-inverting input which is connected to ground.

The discriminator circuit 6, in the embodiment shown comprises a comparator having a first input coupled to the output of the charge integrator 4 and a second input connected to a reference voltage source VREF. The output of the discriminator 6 is coupled via an enable circuit 14 and a buffer circuit 16 to an output terminal 18 at which is provided the output logic.

The enable circuit 14 is in the form of an AND circuit having one input which is connected to receive an output signal from the discriminator 6, and a second input which is coupled to receive an enable signal SEN.

The RAM 12 comprises a mat array of memory cells arranged in rows and columns and any cell of the array can be selectively addressed by the application of appropriate signals along word lines and bit lines which selectively connect to the cells of the array. For simplicity only one row of such memory cells is shown in FIG. 3. From this figure it can be seen that, in essence, each row of the array consists of a number of ferroelectric capacitors $C_{FE}$ connected to a bit line BL and, due to the intrinsic layout of the cell, each row of the array also includes a bit line capacitance $C_1$. Each cell of the row is also connected to a respective word line WL. Each cell of the RAM 12 may be interrogated in a serial manner in order to determine the logic state stored in each cell and, hence, in use, the RAM 12 can be regarded at any point in time as comprising an active cell 20 in combination with a number of inactive cells, such as the inactive cells 22 of the row of cells shown in FIG. 3.

Figure 4:
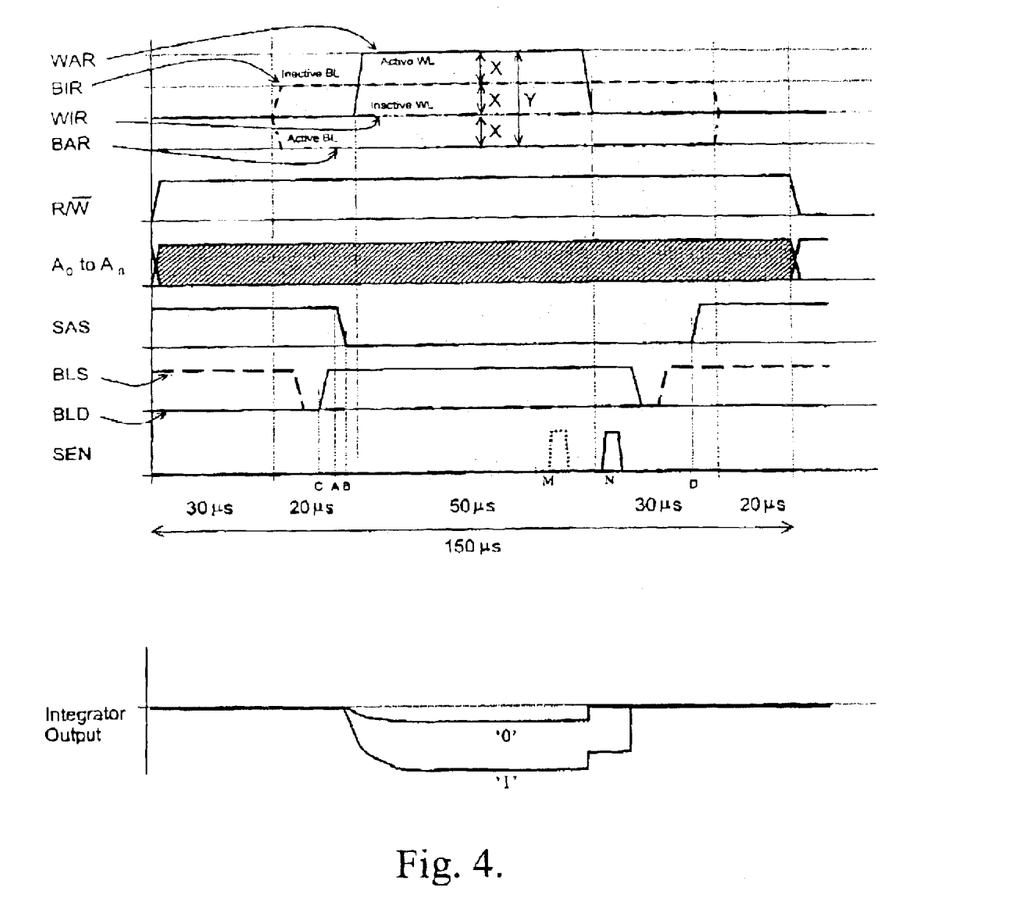
FIG. 4 shows waveform timing diagrams for the operation of a sensing circuit according to the present invention.

The word line WL of the active cell 20 is connected to a signal source 24 which can supply "word active read" WAR and "word active write" WAW signals, as shown in FIG. 4. The inactive cells 22 arc connected by their respective word lines to a signal source 26 which can supply "word inactive read" WIR and "word inactive write" WIW signals to the word lines of the inactive cells 22.

A node 28 between the switch BLS and the RAM 12 is coupled via a further switch BLD to a bit line driver circuit in the form of a signal source 30, which is used to precharge or write data into the cells of the RAM 12. The signal source 30 can selectively supply "bit inactive read" BIR, "bit inactive write" BIW. "bit active read" BAR and "bit active write" BAW signals to the bit line BL of the RAM through the switch BLD.

The switches SAS, BLS and BLD are shown schematically in FIG. 3 as contact switches but in practice these switches would be constituted by any suitable solid state switching device, such as MOSFETs or thin film transistors.

The sensing circuit of the present invention is based upon an operational amplifier which integrates the charge received from the active cell 20. Because one input of the operational amplifier is coupled to earth, the bit line voltage also is effectively clamped at virtual earth. This maximises the voltage swing across the ferroelectric capacitor and, therefore, the charge output from the active cell 20 when there is a switch in polarisation of the active cell. As the voltage on the bit line BL is effectively fixed at virtual earth, the effect of the bit line capacitance is also reduced and does not dominate. Hence, the feedback capacitor 10 of the charge integrator 4 can be selected to be of much smaller capacitance value, thereby increasing the charge to voltage conversion gain and providing good circuit sensitivity.

In operation, firstly the switch BLS is open and the switch BLD is closed and the bit active write BAW signal is fed to the bit line BL from the signal source 30. At the same time, the word inactive write WIW signal is fed to the word lines of the inactive cells 24 by the signal source 26 and the word active write WAW signal is fed to the word line of the active cell 20. The voltage magnitude of the combination of the two write signals BAW and WAW applied between the word line and bit line of active cell 20 is more negative than the voltage $-V_c$ shown in FIG. 1, and hence data is stored in the active cell as a charge $Q_{-1'}$, with zero voltage then being applied across the active cell with the cessation of the signals BAW and WAW.

A timing diagram for a typical read cycle is shown in FIG. 4. To read the stored data, firstly he switch SAS is closed to discharge and therefore reset the feedback capacitor 10 of the charge integrator 4. The switch SAS remains closed until time A shown in FIG. 4 and the period A to B shown in FIG. 4 is the time required for switch SAS to open. Shortly before time A, at time C, the switch BLD, which was closed to couple the signal source 30 to the RAM 12, is opened to disconnect the bit line from the signal source 30 and the switch BLS is closed to couple the first or non inverting input of the amplifier 8 to the bit line BL of the RAM 12 and hence also to the active cell 20. These timings for the operation of switches SAS, BLS and BLD can be seen in FIG. 4.

Charge integration is able to commence from time B when the switch SAS is open and continues until the time when the switch SAS is once again closed to reset the capacitor 10. This timing for the closure of the switch SAS is shown as time D in FIG. 4. However, in view of the characteristic of the ferroelectric capacitor $C_{FE}$, as shown in FIG. 1, it is necessary to excite the ferroelectric capacitor in order to determine whether there is a switch in polarisation state. This is achieved by applying the signals WAR and BAR to the active cell 20 and the signals WIR and BIR to the inactive cells 22. The waveforms and timings for these signals are also shown in FIG. 4.

The RAM actually comprises a matrix array of memory cells, and only one, row of this matrix array is actually shown in FIG. 3. Thus, when a bit line and a word line of the array are made active at any particular point in time, the RAM will include, in essence, an active cell and three forms of inactive cell.

The cell at the cross-over point between the active bit and word lines becomes an active cell. An example is the active cell 20 for the row of cells shown in FIG. 3, which is at the cross-over point of the active word line WL and the active bit line BL. However the RAM will also include cells, on this active bit line which remain inactive because their respective word lines are inactive (inactive cells at the cross-over between an inactive bit lime and active word line), such as the inactive cells 22 shown in FIG. 3. Also, the RAM will include inactive cells which are coupled to the active word line but which remain inactive because their bit lines are inactive (inactive cells at the crossover between an active word line and an inactive bit line), such as the cells in another row of the matrix (not shown in FIG. 3) which are coupled to the word line WL. Furthermore, the RAM will also include inactive cells which are at the cross-over point of an inactive word line and an inactive bit line, such as cells of another row of the matrix (not shown in FIG. 3) which also are not coupled to the active word line WL shown in FIG. 3.

For the inactive cells of the RAM which are at the crossover between an active bit line and an inactive word line, such as the inactive cells 22 of the row of cells shown in FIG. 3, the signals BAR and WIR are applied respectively to the bit and word lines of these cells.

For the inactive cells of the RAM which are at the crossover between an inactive bit line and an inactive word line, the signals BIR and WIR are applied respectively to the bit and word lines of these cells.

For the inactive cells of the RAM which are at the cross-over between an inactive bit line and an active word line, the signals BIR and WAR are applied respectively to the bit lines and word lines of these cells.

It can be seen from FIG. 4 that the signal WIR is a constant level signal, which is applied throughout the sensing cycle. The signal BIR is a pulse which is applied to the inactive cells 22 throughout the period of charge integration, i.e. the period during which the switch SAS remains open, shown as the period B to D in FIG. 4. In the example shown in FIG. 4, the signal BIR has a duration of about 100 $\mu$S, lasting from about 30 $\mu$S after the commencement of the sensing cycle until about 20 $\mu$S prior to the termination of the sensing cycle. The signal BIR is applied shortly before and terminates shortly after completion of the charge integration period, the voltage between the bit and word lines of the inactive cells is stable throughout the sensing cycle. The combinations of signals BAR-WIR, BIR-WAR, and BIR-WIR each provide a voltage between the bit and word lines of all of the inactive cells throughout the charge integration period of magnitude X, as shown in FIG. 4, and this value X is less than the voltage $V_c$ shown in FIG. 1, so that these cells all rein inactive for the duration of the charge integration period B to D.

Similar to the signal BAR, the signal BIR is also a pulse signal and this is applied to the bit line of the active cell at the same time and for the same duration as the pulse signal BIR applied to the bit lines of the inactive cells 22. However, the pulse signal BAR is of opposite polarity to the pulse signal BIR. Because the pulse signals BIR and BAR are applied at the same time and for the same duration, this means that, conveniently, they may be supplied from the common signal source 30, with one of the pulse signals being passed through an inverter to provide the two pulse signals of opposite polarity. This assists in minimising the circuit requirements for the signal sources for the sensing circuit.

For the active cell 20, as shown in FIG. 3, which is located at the crossover of an active bit line BL and an active word line WL, the pulse signal BAR is applied to the bit line from the signal source 30 and the pulse signal WAR is applied to the word line from the signal source 24. The signal BAR is a pulse of about 100 $\mu$S duration which is applied to the active cell 20 throughout the period of charge integration; i.e. for at least the period during which the switch SAS remains open, shown as the period B to D in FIG. 4. In the example shown in FIG. 4 the signal WAR has a period of about 50 $\mu$S.

The pulse signal WAR is applied to the word line of the active cell 20 almost immediately after opening of the switch SAS; i.e. effectively at the start of the charge integration period. The signal pulse WAR is arranged to have a duration of about 50 μS and the signal pulse BAR is present on the bit line BL prior to the opening of the switch SAS. The combination of signal pulses WAR-BAR therefore causes a voltage Y, as shown in FIG. 4, to be applied to the active cell 20 for the duration of the signal pulse WAR during the sensing cycle. The voltage Y exceeds the voltage $V_c$ shown in FIG. 1 and is sufficient therefore to excite the ferroelectric capacitor of the active cell and cause the capacitor to change polarisation states. Because the signal WAR is applied to the active cell almost in coincidence with the commencement of the charge integration period, the ferroelectric capacitor can be excited for a sufficiently long period to, ensure that charge transfer can be completed. In the example shown, the pulse signal WAR has a duration of 50 μS, which leaves sufficient time during the sensing cycle to apply a sense enable pulse SEN to the enable circuit 14 and to operate the switches SAS, BLS and BLD in readiness for the next cycle. However, it should be realised that whilst certain specific timings and pulse durations are shown in FIG. 4, these are merely exemplary and faster timing and therefore a more concise sensing cycle could be achieved. Furthermore a faster amplifier in the charge integrator circuit 4 and/or a ferroelectric material with a faster response timing could also be used.

With regard to pulse timings, the sense pulse SEN is shown in FIG. 4 as occurring at a timing N shortly after the cessation of the signal pulse WAR. Because there is a change in polarisation, a net amount of charge Q, which is equal to the change in charge $Q_{+0} - Q_{+1}$, shown in FIG. 1, flows into the capacitor 10 of the integrator circuit 4. When the charge transfer is complete and the voltage $V_{OUT}$ at output terminal 32 of the charge integrator circuit 4 has reached a steady state condition, the voltage $V_{OUT}$ is given by the formula:

$$V_{OUT} = V_{os} - \frac{Q}{Cfb}$$

where $V_{os}$ is the input offset voltage at the non-inverting input of the amplifier 8 and Cfb is the value of the feedback capacitor 10. As mentioned above, $V_{os}$ can be held at virtual earth and the value of the intrinsic bit line capacitance does not dominate so Cfb, the value of the feedback capacitor 10, can be made very small. Hence, a relatively large swing in the output voltage $V_{OUT}$ can be obtained for relatively small values of Q. The change in the voltage $V_{OUT}$ which occurs at the output terminal 32 of the charge integrator 4 is also shown in FIG. 4. At the start of the charge integration period the voltage $V_{OUT}$ is at virtual earth and the change in charge which is fed out from the active cell 20 and which flows into the capacitor 10 causes the charge integrator output voltage to go negative. The extent to which the charge integrator output voltage goes negative is dependent upon whether there is a logic '1' or a logic '0' stored in the active cell, 20. If a logic '1' is stored the voltage $V_{OUT}$ goes more negative than if a logic '0' is stored because, in the case of logic '1', there is a change in the polarisation state of the active cell and thus there is a larger net amount of charge which flows into and charges the capacitor 10. However, in either case the charge transfer is completed relatively quickly during the sensing cycle and the output voltage $V_{OUT}$ adopts one of two steady state negative values, dependent upon a stored logic '0' or a logic '1', as shown in FIG. 4. The sense pulse SEN can therefore be applied at any time after the charge transfer is complete and the output voltage $V_{OUT}$ has adopted one or the other of these steady state values. Thus, the sense pulse can also be applied before the termination of the signal pulse WAR, as shown by timing M in FIG. 4, which can give rise to an overall reduction in the time period for the sensing cycle.

The output voltage $V_{OUT}$ is compared to the voltage VREF in the comparator circuit of discriminator 6 and the voltage at output 34 of discriminator 6 is arranged to be at +V volts when the voltage at output 32 exceeds the voltage VREF and −V volts when the voltage at output 32 is less than the voltage VREF. Hence, a very positive swing in the voltage at output 34 is obtained, even for relatively small values of charge Q fed from the active cell when a change in polarisation state occurs.

The voltage of +V volts at output 34 is fed to one input of enable circuit 14 which is in the form of an AND circuit. The other input of the AND circuit receives a signal from the voltage source SEN and this signal is in the form of a short pulse which occurs during the integration period. Hence, a pulse of magnitude +V volts occurs at the output of enable circuit 14 which is fed through the buffer circuit 16 to output 18.

Although an AND circuit is shown in FIG. 3, the AND function can also be provided by other circuit configurations) such as a combination of NOR circuits and inverters.

It will be realised from the above description that a very positive indication of a change in polarisation of the active cell, and hence the logic status of the active cell, is provided at the output 18 even for relatively small values of Q. Furthermore, because a sense amplifier based on charge integration is used, there is no reduction in the effective voltage between the word line and the bit line of the active cell when a change in polarisation occurs and hence a relatively small excitation voltage can he used, with reduced power consumption. Moreover, because the bit line voltage is effectively clamped at virtual earth, the voltage swing across the ferroelectric capacitor, and therefore the output charge when there is a switch in polarisation, can be maximised. Additionally, as the bit line voltage is fixed, the effect of the intrinsic bit line capacitance is reduced which means that the value of the feedback capacitor of the integrating sense amplifier can be made much smaller to maximise also the charge to voltage conversion gain.

Figure 5:
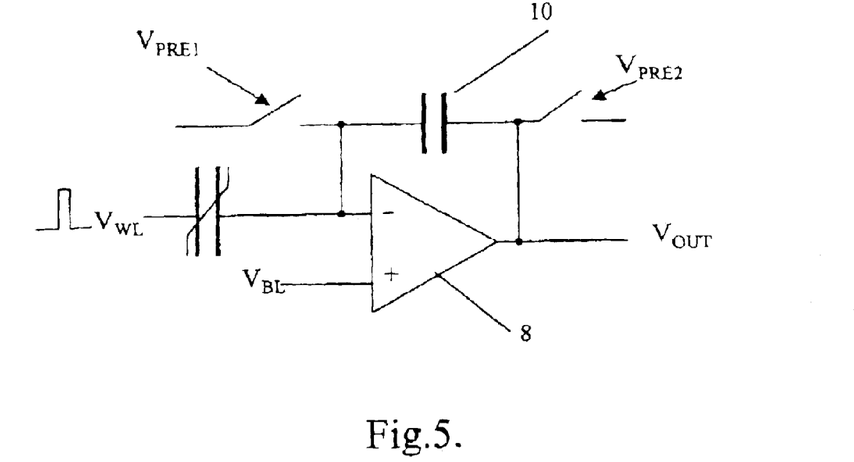
FIG. 5 shows an alternative embodiment of a charge integrator circuit for use in the circuit illustrated in FIG. 3.

In the embodiment shown in FIG. 3 the output voltage of the charge integrator 4 goes negative when charge integration occurs and thus the discriminator circuit 6 must be designed to handle negative input voltages. The reference voltage VREF must also be provided as a negative voltage, which increases the complexity of the overall circuit design, FIG. 5 shows an alternative embodiment for the charge integrator 4 which provides a positive voltage $V_{OUT}$ to be provided at the output of the charge integrator and thus ensures that a positive voltage is always fed to the discriminator circuit 6. This also enables the reference voltage VREF to be provided as a positive voltage, simplifying the overall circuit design.

The charge integrator 4 shown in FIG. 5 comprises the amplifier 8 and the feedback capacitor 10. The amplifier 8 is coupled to the word line and the bit line of the circuit in the same manner as the embodiment shown in FIG. 3. However, in this embodiment the reset switch SAS is not provided and instead each side of the capacitor 10 is coupled via respective precharge switches $V_{PRE1}$ and $V_{PRE2}$ to appropriate voltage supply sources which enable the output of the charge integrator and thus the non inverting input of the discriminator 6 to be precharged to a positive voltage. Conveniently, $V_{PRE1}$ and $V_{PRE2}$ can be coupled, respectively, to virtual ground and to the positive supply voltage VDD for the sensing circuit.

In operation, when the charge integrator 4 of FIG. 5 is reset prior to commencement of a sensing cycle, the switches $V_{PRE1}$ and $V_{PRE1}$ are both closed. One side of the capacitor 10 is therefore connected to virtual ground through the switch $V_{PRE1}$ and the other side of the capacitor, and hence the output of the charge integrator, is coupled to the positive supply voltage VDD. The output voltage is therefore in this embodiment precharged to the supply voltage VDD.

Figure 6:
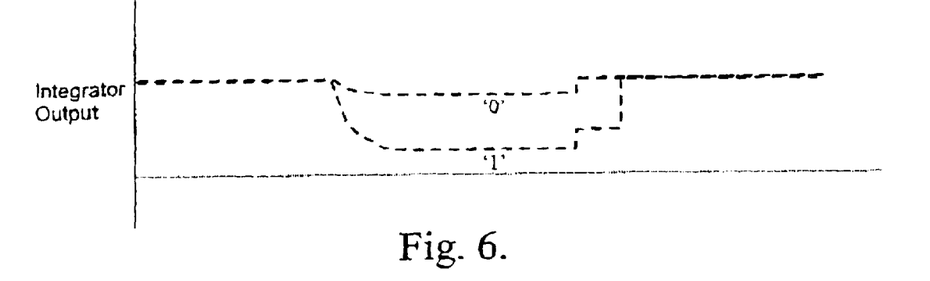
FIG. 6 shows the output voltage of the charge integrator illustrated in FIG. 5 during a sensing cycle.

FIG. 6 shows the voltage $V_{OUT}$ at the output of the charge integrator during a sensing cycle for this embodiment. When the switches $V_{PRE1}$ and $V_{PRE2}$ are opened and the charge integration cycle commences, the change in charge of the active cell, which charges the capacitor 10, causes a negative swing in the output voltage $V_{OUT}$ of the charge integrator 4. However, because the voltage $V_{OUT}$ has been precharged to he positive supply voltage. VDD, the output voltage VOUT remains positive throughout tie sensing cycle, as shown in FIG. 6. This embodiment is considered to be particularly beneficial as it enables the sensing circuit to operate solely with positive voltage signals, significantly simplifying overall circuit design.

The present invention has been described with reference to a single bit line of a RAM array. However, it will be realised that the integrating sense amplifier may also be connected to a group of bit lines, with the selection of any bit line being controlled by a multiplexor circuit. The present invention may therefore be used with high capacity non-volatile memory circuits whilst providing low power operation. It is particularly suitable therefore for use with portable light-weight equipment operating from an integral voltage source, such as lap top computers. Furthermore, the integrating sense amplifier can be used with either active or passive matrix ferroelectric RAMs.

Because the present invention provides very efficient charge to voltage conversion, it can also be used in any application where it is required to sense very small changes in the level of charge such as biosensors, including fingerprint sensors and DNA sensors of the type in which detection is based upon storing an electrical charge on an electrode, and charge coupled devices, such as CCD cameras and microscopes.

The aforegoing description has been given by way of example only and it will be appreciated by a person skilled in the art that modifications can be made without departing from the scope of the present invention. For example, in the embodiment described, the discriminator comprises a comparator circuit. However, an inverter circuit may be used in which the inverter output is arranged to switch between two levels when an output signal is received from the charge integrator circuit which exceeds a reference value. The inverter output may be arranged so that the output switches from a high to a low level when the reference value is exceeded, or vice versa.

What is claimed is:

1. A method of operating a sensing circuit comprising a charge integrator circuit, coupled in series with a discriminator circuit and arranged to receive an electrical charge stored in a capacitor element of an array of capacitor elements each for storing an electrical charge, the method comprising applying a first pulse signal to the said capacitor element and to selected other capacitor elements in the array, applying a second pulse signal to the said capacitor element and to selected other capacitor elements in the array, applying third and fourth pulse signals to selected other capacitor elements in the array, the first, second, third and fourth pulse signals being arranged to cause the electrical charge stored in the said capacitor element to be transferred to the charge integrator circuit but not to cause charge stored in other capacitor elements to be transferred to the charge integrator circuit.

2. A method according to claim 1, wherein the second and third pulse signals are provided from a common signal source with one of the signals being provided via an inverter circuit.

3. A method according to claim 1, wherein the first pulse signal has a duration shorter than the second pulse signal.

4. A method according to claim 1 wherein the capacitor elements are selected to comprise ferroelectric capacitor elements and the first and second pulse signals are arranged to cause the said capacitor element to change from a first polarization state to a second polarization state to transfer the electrical charge to the charge integrator circuit.

5. A method according to claim 1, wherein the charge integrator circuit is selected to comprise an amplifier having a feedback capacitor coupled between an input and an output of the amplifier, and providing first switching means for coupling one side of the feedback capacitor to a first electrical supply, and second switching means for coupling the other side of the feedback capacitor to a further electrical supply.

6. A method according to claim 5, wherein the first electrical supply is selected to be virtual ground and the further electrical supply is selected to be a positive supply voltage, and wherein the method comprises closing the first and second switching means so as to precharge an output terminal of the charge integrator circuit to the positive supply voltage prior to commencement of a sensing cycle.

7. A method according to claim 1, wherein the discriminator circuit is selected to comprise a comparator circuit having a first input arranged to receive an output signal from the charge integrator circuit and a second input arranged to receive a reference voltage signal.

8. A method according to claim 1, wherein the discriminator circuit is selected to comprise an inverter circuit arranged to provide an output signal which changes from a first level to a second level less than the first level when the magnitude of an output signal from the integrator circuit exceeds a reference value.

9. A method according to claim 1 comprising providing first switching means for selectively coupling an input of the charge integrator circuit to the capacitor element.

10. A method according to claim 9 comprising providing further switching means for coupling the first switching means to a bit line driver circuit.

11. A method according to claim 1 comprising feeding an output signal from the discriminator circuit to a first input of an enable circuit and providing a further signal to a second input of the enable circuit, thereby to provide an output signal indicative of the electrical charge on the capacitor element in response to the further signal.

12. A method according to claim 11, comprising providing the further signal to the enable circuit during the application of the voltage pulse across the ferroelectric capacitor.

13. A method of operating a sensing circuit comprising a charge integrator circuit coupled to a first and second group of a plurality of capacitor elements and a discriminator circuit, the method comprising transferring a first electrical charge stored in a first capacitor element of the first group, and during the transferring of the first electrical charge, a second electrical charge stored in a second capacitor element of the second group is not being transferred to the charge integrator circuit.

14. A method according to claim 13, further comprising supplying a first signal to the first capacitor element during at least part of a first period of the transferring of the first electrical charge.

15. A method of according to claim 14, further comprising supplying a second signal to the second capacitor during at least part of the first period.

16. A method according to claim 15, further comprising supplying a third signal to at least one of the first capacitor or the second capacitor.

17. A method according to claim 16, in which said capacitor elements comprise ferroelectric capacitors, said method further comprising controlling the polarization state of the first or second capacitor by the second signal and the third signal.

18. A sensing circuit for sensing an electrical charge comprising:
    a charge integrator circuit coupled to an electrode for storing the electrical charge through a switching element, and
    a discriminator circuit coupled in series with the charge integrator circuit, the discriminator circuit having a first input arranged to receive an output signal from the charge integrator circuit.

19. A sensing circuit as claimed in claim 18, in which said discriminator circuit further comprises a second input arranged to receive a referrence voltage signal.

20. A sensing circuit for sensing an electrical charge comprising:
    a charge integrator circuit coupled to an electrode for storing the electrical charge; and
    a discriminator circuit coupled in series with the charge integrator circuit, the discriminator circuit having a first input arranged to receive an output signal from the charge integrator circuit,
    the charge integrator circuit including an amplifier, a feedback capacitor coupled between an input terminal and an output terminal of the amplifier for storing the electrical charge received from the electrode, first switching means coupled to one side of the feedback capacitor for connecting the said one side to a first electrical supply and second switching means coupled to the other side of the feedback capacitor for coupling the said other side to a further electrical supply.

21. A sensing circuit according to claim 18, wherein the discriminator circuit comprises a comparator circuit having a first input arranged to receive the output signal from the integrator circuit and a second input arranged to receive a reference voltage signal.

22. A sensing circuit for sensing an electrical charge comprising:
    a charge integrator circuit coupled to an electrode for storing the electrical charge; and
    a discriminator circuit coupled in series with the charge integrator circuit, the discriminator circuit having:
    a first input arranged to receive an output signal from the charge integrator circuit, and
    an inverter circuit arranged to provide an output signal indicative of the electrical charge.

23. A sensing circuit for sensing an electrical charge comprising:
    a charge integrator circuit coupled to an electrode for storing the electrical charge; and
    a discriminator circuit coupled in series with the charge integrator circuit, the discriminator circuit having a first input arranged to receive an output signal from the charge integrator circuit,
    said sensing circuit further comprising an enable circuit arranged to receive an output signal from the discriminator circuit on a first input and to provide an output signal indicative of the electrical charge in response to a further signal received on a second input.

24. A sensing circuit as claimed in claim 23, in which said enable circuit comprises an AND circuit.

25. A sensing circuit according to claim 18, wherein the electrode comprises an electrode of a capacitor element.

26. A sensing circuit according to claim 25, wherein there are a plurality of a capacitor elements.

27. A sensing circuit according to claim 26, wherein the plurality of capacitor elements comprise at least one of a ferroelectric capacitor, a ferroelectric gate transistor, or a charge coupled device.

28. A sensing circuit according to claim 18, wherein the electrode comprises an electrode of a ferroelectric capacitor, a ferroelectric gate transistor, or a charge coupled device.

29. A biosensor comprising, a sensing circuit according to claim 18.

30. A biosensor according to claim 29 comprising a DNA sensor.

31. A biosensor according to claim 29 comprising a fingerprint sensor.

* * * * *